(12) United States Patent
Mason et al.

(10) Patent No.: US 6,436,588 B1
(45) Date of Patent: Aug. 20, 2002

(54) METHOD AND SYSTEM FOR VARYING THE TRANSMISSION OF AN ATTENUATED PHASE SHIFT MASK

(75) Inventors: Mark E. Mason, Dallas; Steven D. Carlson, Parker; James D. Hurst, Allen, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 91 days.

(21) Appl. No.: 09/711,120

(22) Filed: Nov. 9, 2000

Related U.S. Application Data
(60) Provisional application No. 60/172,879, filed on Dec. 20, 1999.

(51) Int. Cl.[7] ................................................. G03F 9/00
(52) U.S. Cl. ......................................................... 430/5
(58) Field of Search ...................... 430/5, 322; 378/35; 355/53

(56) References Cited

U.S. PATENT DOCUMENTS 6,163,367 A  * 12/2000 obszarny ...................... 355/53
6,277,528 B1 *  8/2001 Tzu et al. ....................... 430/5

* cited by examiner

*Primary Examiner*—S. Rosasco
(74) *Attorney, Agent, or Firm*—Jacqueline J. Garner; W. James Brady, III; Frederick J. Telecky, Jr.

(57) ABSTRACT

A system for varying the transmission of an attenuated phase shift mask (14) is provided that includes an attenuated phase shift mask (14), a transparent support (16) and a modulation system (18). The mask (14) comprises a variable transmission material. The transparent support (16) supports the mask (14). The modulation system (18) is operable to apply a variable force at the mask (14) to control the transmission of the mask (14).

22 Claims, 2 Drawing Sheets

METHOD AND SYSTEM FOR VARYING THE TRANSMISSION OF AN ATTENUATED PHASE SHIFT MASK

This application claims priority under 35 USC § 119(e)(1) of provisional application No. 60/172,879 filed Dec. 20, 1999.

TECHNICAL FIELD OF THE INVENTION

This invention relates generally to photolithography and more particularly to a method and system for varying the transmission of an attenuated phase shift photomask.

BACKGROUND OF THE INVENTION

Integrated circuits are used as a basic design part in many varied applications ranging from radios and alarm clocks to high performance computers. The fabrication of these integrated circuits involves the creation of electronic circuits on semiconductor wafers. This process generally includes a series of procedures which maybe categorized into four basic operations. These operations are layering, patterning, doping and heat treating.

Patterning is the process of creating a pattern on a wafer, generally accomplished through photolithography and etching. Photolithography involves the transfer of a pattern from a mask to a wafer with light. This process is completed in a device referred to as a stepper, or scanner. A stepper includes a light source and a mask, in addition to other components. A mask for use in the stepper is fabricated with a desired pattern that corresponds to features to be formed on the wafer. A layer of photoresist, which is a material that is sensitive to light, is applied to the wafer. Light is passed through the mask and impinges on the photoresist in accordance with the pattern of the mask, thereby altering the exposed photoresist. The altered photoresist is then removed by development, while the unaltered photoresist remains as a protective layer over the wafer. Thus, parts of the wafer which require further processing are made available, while the remaining parts of the wafer are protected.

While some applications allow the use of masks which completely block the light from passing through, others require attenuated phase shift masks which allow a relatively small percentage of the light to pass through. A conventional attenuated phase shift mask allows a single, specific percentage of light to pass through. The desired percentage of light transmission through an attenuated phase shift mask for a particular application is experimentally determined by fabricating and testing several different masks, each with a unique transmission percentage. Typically only three or four masks are fabricated for testing due to the extremely high cost of fabrication. Thus, because only a few masks are available for testing due to their expense, it is difficult to identify precisely an optimum transmission percentage.

SUMMARY OF THE INVENTION

In accordance with the present invention, a method and system for varying the transmission of a single attenuated phase shift mask are provided that substantially eliminate or reduce disadvantages and problems associated with previously developed attenuated phase shift masks. In particular, an attenuated phase shift mask is constructed from a material with a transmission percentage that may be controlled by application of a force.

In one embodiment of the present invention, a system for varying the transmission of an attenuated phase shift mask is provided that includes an attenuated phase shift mask, a transparent support and a modulation system. The mask comprises a variable transmission material. The transparent support supports the mask. The modulation system is operable to apply a variable force at the mask to control the transmission of the mask.

Technical advantages of the present invention include providing an improved attenuated phase shift mask. In particular, the attenuated phase shift mask comprises a variable transmission material that is capable of changing its transmission percentage with the application of an outside force. As a result, a single mask may be fabricated for a particular application. The optimum transmission percentage may be determined by varying the transmission percentage of the mask. Thus, the cost is substantially reduced by eliminating the requirement of fabricating a plurality of masks. Additionally, an optimum transmission percentage may be determined, as opposed to simply choosing a transmission percentage based on the better results obtained from a few discrete transmission percentages.

Other technical advantages will be readily apparent to one skilled in the art from the following figures, description, and claims.

BRIEF DESCRIPTION OF THE DRAWINGS

For a more complete understanding of the present invention and its advantages, reference is now made to the following description taken in conjunction with the accompanying drawings, wherein like numerals represent like parts, in which.

DETAILED DESCRIPTION OF THE INVENTION

Figure 1:
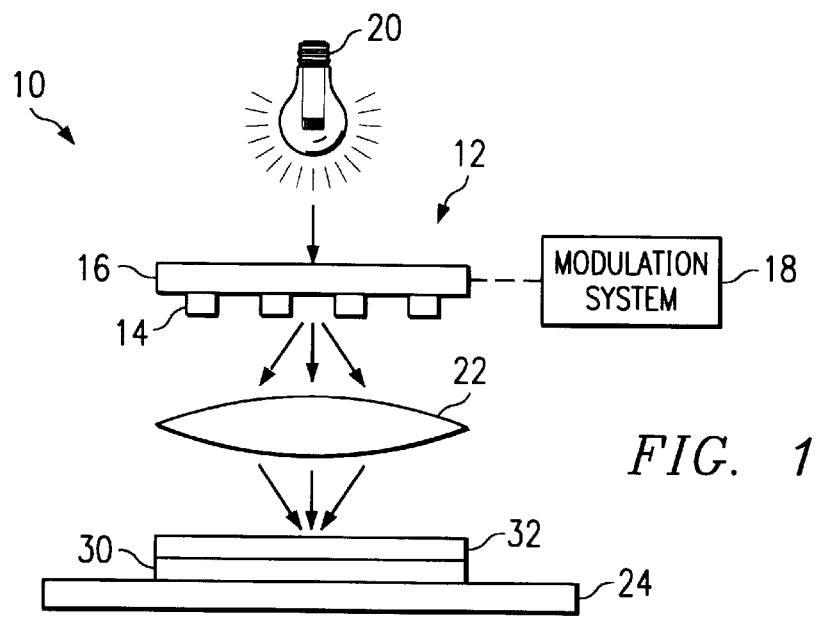
FIG. 1 is a block diagram illustrating a stepper for fabricating an integrated circuit in accordance with one embodiment of the present invention.

FIG. 1 is a block diagram illustrating a stepper, or scanner, 10 for fabricating an integrated circuit in accordance with one embodiment of the present invention. The stepper 10 includes a reticle 12 for providing a pattern of light and dark areas, a light source 20 for providing light, a reduction lens 22 for focusing and reducing light, and a stage 24 on which a silicon wafer 30 with a layer of photoresist 32 may be positioned.

The reticle 12 comprises an attenuated phase shift mask 14 for partially blocking light from the light source 20, a transparent support 16 for supporting the mask 14, and a modulation system 18 for controlling the transmission percentage of light passing through the mask 14. Thus, the pattern of light and dark areas provided by the reticle 12 is based on the mask 14. The modulation system 18 may or may not be coupled to the reticle 12, as described in more detail below.

The mask 14 is a phase shift mask in that the phase of the light passing through the mask 14 is shifted in relation to the phase of the light passing unaltered through the transparent support 16. The amount of the shift is based on the thickness of the material that forms the mask 14. For photolithographic applications, the thickness of the material is chosen such that the phase shift is 180°. It will be understood, however, that the teachings of the present invention may be used with masks having a phase shift other than 180° in accordance with other suitable applications for phase shift masks.

Unattenuated phase shift masks may comprise chrome or other suitable material for blocking essentially 100% of the light provided by the light source. Attenuated phase shift masks, on the other hand, comprise a material that allows a relatively small percentage of the light to pass through. For example, this material may be chromium oxide, molybdenum silicide, or other suitable material that allows from about 5% to about 12% of the light provided by the light source 20 to pass through.

The attenuated phase shift mask 14 may be used, for example, in applications in which the wavelength of the light provided by the light source 20 is on the same order of magnitude as the features that are being formed on the wafer 30. Under these conditions, light and dark areas provided by an unattenuated mask may not be distinguishable at the photoresist layer 32. Thus, in order to accentuate the difference between light and dark areas, an attenuated phase shift mask 14 is used.

One factor in designing the attenuated phase shift mask 14 is the transmission percentage, which is the percentage of light provided by the light source 20 that is allowed to pass through the mask 14. With too little light transmission, the difference between light and dark areas is not accentuated enough to provide an improvement over an unattenuated mask. With too much light transmission, the features tend to form in unintended areas of the wafer 30.

Thus, the mask 14 comprises a variable transmission material that is capable of changing its transmission percentage by at least 1% with the application of an outside force by the modulation system 18. Preferably, the material is capable of changing its transmission percentage by about 5% to about 20% for maximum versatility. This allows the mask 14 to be used in varying applications which require different transmission percentages, as well as to be fine-tuned to an optimal transmission percentage for each application. In general, the mask 14 may comprise lithium, niobate, lithium tantalate, barium tantalate, or other suitable variable transmission material including Pockels- and Kerr-type materials.

The transparent support 16 allows essentially 100% of the light impinging on the support 16 to pass through the support 16. The support 16 thus comprises glass, quartz, or other suitable transparent material which allows at least about 95% of light impinging on the material to pass through. Additionally, although FIGS. 1–6 depict light from the light source 20 impinging first on the support 16 and then on the mask 14, it will be understood that the light may impinge first on the mask 14 and then on the support 16 without departing from the scope of the present invention.

As described in more detail below, the modulation system 18 may apply an electric field, a magnetic field, thermal stress or mechanical stress to the mask 14 in order to change the transmission percentage of the mask. It will be understood that the modulation system 18 may apply other suitable forces to the mask 14 for changing the transmission percentage without departing from the scope of the present invention.

The light source 20 may comprise a mercury vapor arc lamp, a krypton fluoride laser, an argon fluoride laser, a fluoride laser, or other suitable source of energy capable of altering the properties of a resist material. The light source 20 provides light to the reticle 12 which partially blocks the light in accordance with the pattern of the mask 14. The reduction lens 22 is formed in such a way as to focus the patterned light and to reduce the pattern by about four or five times.

In operation, the stepper 10 provides light from the light source 20 to the reticle 12. The mask 14 of the reticle 12 forms a pattern that partially blocks the light. The transparent support 16 allows essentially 100% of the light provided by the light source 20 to pass through. The mask 14 allows a relatively small percentage of the light to pass through based on the force applied to the mask 14 by the modulation system 18. Thus, light and dark areas are provided by the reticle 12 based on the pattern of the mask 14 and on the force applied to the mask 14. This patterned light is provided to the reduction lens 22, which focuses the light and typically reduces the pattern of light and dark areas by about four or five times.

The reduced pattern of light then impinges on the photoresist layer 32 on the wafer 30 that has been positioned on the stage 24. Chemical or plasma etching or other suitable techniques may then be used to remove portions of the photoresist layer 32 based on the pattern of the mask 14 in order to expose corresponding portions of the wafer 30 for further processing. For example, the portions of the photoresist layer 32 corresponding to light areas maybe removed, while the portions of the photoresist layer 32 corresponding to dark areas remain on the wafer 30.

Figure 2:
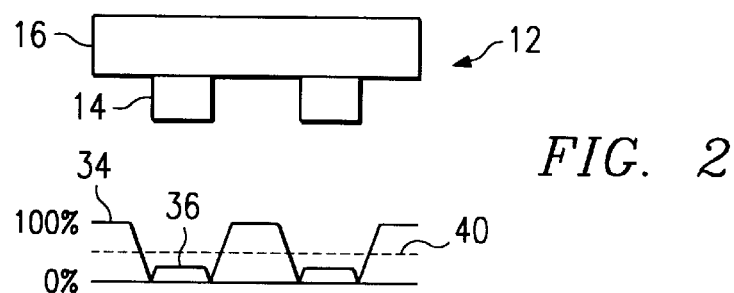
FIG. 2 is a graphical depiction of the intensity of light transmitted by the mask of FIG. 1.

FIG. 2 is graphical depiction of the intensity of light passing through the reticle 12. The intensity of the light passing through the reticle 12 varies with the transmission percentage of the mask 14, in addition to the intensity of the light provided by the light source 20. Thus, the modulation system 18 is used to control the transmission percentage in order to optimize the resolution of the patterned light impinging on the photoresist layer 32.

As shown in FIG. 2, essentially 100% of the light impinging on the reticle 12 passes through the transparent support 16 to provide light areas 34 on the photoresist layer 32, while a reduced percentage of the light passes through the mask 14 to provide dark areas 36 on the photoresist layer 32. A photoresist threshold line 40 is shown to indicate the intensity of light over which the photoresist layer 32 will be altered such that it becomes removable by an etch process and under which the photoresist layer 32 will remain unaltered such that it is not removed by the etch process. The level of the photoresist threshold line 40 varies based on the characteristics of the material of the photoresist layer 32. If the transmission percentage through the mask 14 is too high, the intensity of the dark areas 36 will rise above the photoresist threshold 40, causing features to be formed on the wafer 30 in unintended areas. This is prevented by varying the transmission percentage to an optimal level with the modulation system 18.

Figure 3:
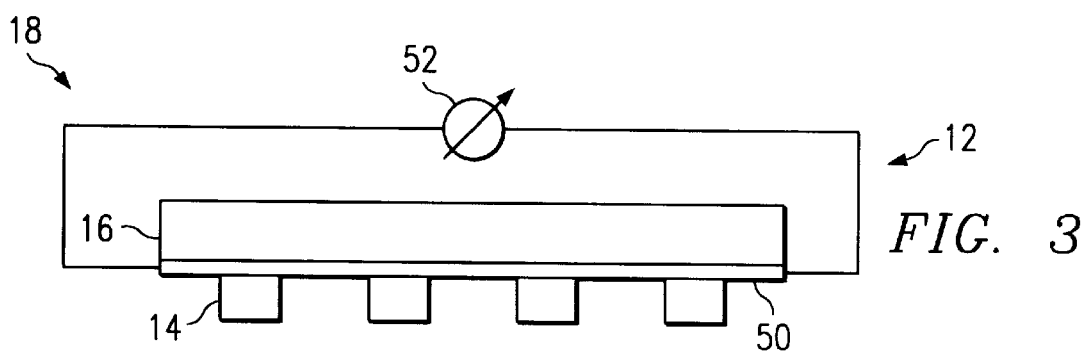
FIG. 3 is a block diagram illustrating the modulation system of FIG. 1 for varying the transmission of the mask in accordance with one embodiment of the present invention.

FIG. 3 is a block diagram illustrating the modulation system 18 for varying the transmission of the attenuated phase shift mask 14 in accordance with one embodiment of the present invention. According to this embodiment, the transmission percentage of the mask 14 is variable based on the strength of an electric field applied to the mask 14. In this embodiment, the mask 14 may comprise bismuth silicon oxide, a non-linear organic polymer such as DAST™, lithium niobate, or other suitable variable transmission material having a transmission percentage that varies with the application of an electric field.

Referring to FIG. 3, a transparent electrode 50 is coupled between the mask 14 and the transparent support 16. It will be understood that the mask 14 may be coupled between the electrode 50 and the support 16 without departing from the scope of the present invention. Alternatively, the electrode 50 may function as the support 16 or at least part of the support 16. The electrode 50 has a transmission percentage of essentially 100%. The electrode 50 comprises an electrically conductive material, such as indium tin oxide or other suitable conductive material. The electrode 50 is coupled to an adjustable power source 52.

In operation, the adjustable power source 52 is applied to the electrode 50 for generating the electric field. The source 52 may be a current source or a voltage source that is adjustable to varying levels. In order to maintain a constant transmission percentage, the source 52 should provide a constant current or a constant voltage to the electrode 50 while the photoresist layer 32 is being exposed to light from the light source 20. However, in accordance with another embodiment of the present invention, the electric field generated by the source 52 may be varied while the photoresist layer 32 is being exposed to light from the light source 20. In this way, the transmission percentage can be adjusted as the photoresist layer 32 changes during exposure.

Figure 4:
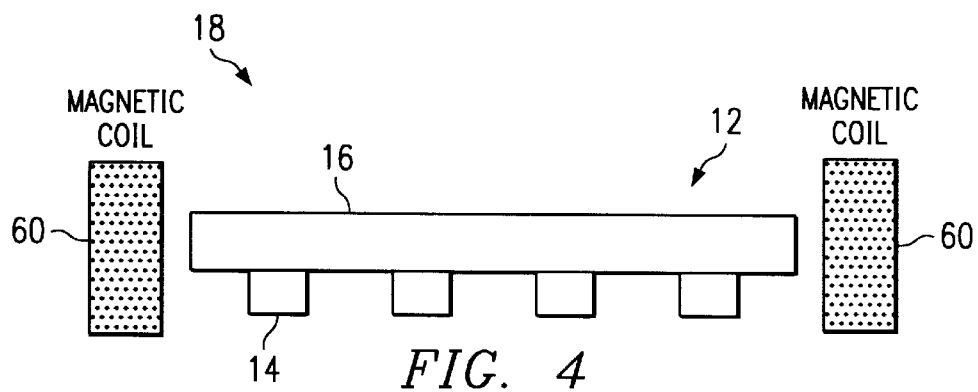
FIG. 4 is a block diagram illustrating the modulation system of FIG. 1 for varying the transmission of the mask in accordance with a second embodiment of the present invention.

FIG. 4 is a block diagram illustrating the modulation system 18 for varying the transmission of the attenuated phase shift mask 14 in accordance with a second embodiment of the present invention. The transmission percentage of the mask 14 is variable based on the strength of the magnetic field provided by the magnetic coils 60. Thus, the mask 14 may comprise ferrous cobalt, ferrous nickel, ferrous palladium, or other suitable variable transmission material having a transmission percentage that varies with the application of a magnetic field.

Referring to FIG. 4, the modulation system 18 includes magnetic coils 60 that are placed in proximity to the reticle 12. In operation, the magnetic coils 60 apply a magnetic field to the mask 14 that is adjustable to varying levels. Although the embodiment shown in FIG. 4 shows two magnetic coils 60, it will be understood that any suitable number of magnetic coils 60 may be utilized without departing from the scope of the present invention.

According to the embodiment in which the transmission percentage is constant during exposure, the magnetic coils 60 are designed to provide a uniform magnetic field to the mask 14 that corresponds to the desired transmission percentage. However, for the embodiment in which the transmission percentage is adjusted during exposure, the magnetic coils 60 provide an oscillating magnetic field.

Figure 5:
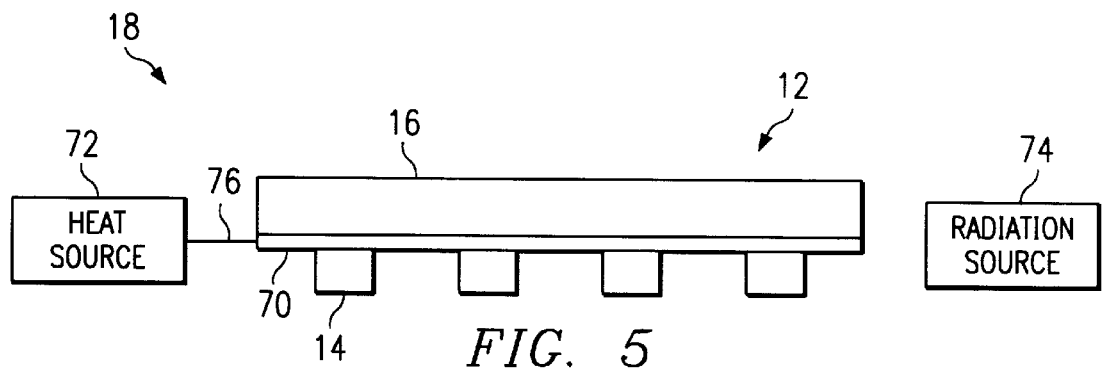
FIG. 5 is a block diagram illustrating the modulation system of FIG. 1 for varying the transmission of the mask in accordance with a third embodiment of the present invention.

FIG. 5 is a block diagram illustrating the modulation system 18 for varying the transmission of the attenuated phase shift mask 14 in accordance with a third embodiment of the present invention. According to this embodiment, the transmission percentage of the mask 14 is variable based on the temperature of the mask 14. Thus, the mask 14 may comprise polydispense polystyrene, crystalline calcite, crystalline fluorite, or other suitable variable transmission material having a transmission percentage that varies with the application of thermal stress.

Referring to FIG. 5, the modulation system 18 includes a transparent thermal plate 70, as well as an adjustable heat source 72 and/or an adjustable radiation source 74. The thermal plate 70 is coupled between the mask 14 and the transparent support 16. It will be understood that the mask 14 may be coupled between the thermal plate 70 and the support 16 without departing from the scope of the present invention. Alternatively, the thermal plate 70 may function as the support 16 or at least part of the support 16. For the embodiment shown, the thermal plate 70 has a coefficient of thermal expansion that is matched to the coefficient of thermal expansion for the support 16. The thermal plate 70 has a transmission percentage of essentially 100% and comprises a thermally conductive material, such as indium tin oxide or other suitable transparent conductive material.

In operation, the adjustable heat source 72 and/or the adjustable radiation source 74 heats the thermal plate 70, and thus the mask 14, to a specified temperature. The temperature is chosen based on the transmission percentage desired for the mask 14. The mask 14 is maintained at the specified temperature as long as the desired transmission percentage for the mask 14 remains constant.

The heat source 72 may be coupled to the thermal plate 70 through a conductor 76 in order to provide heating through conduction. In accordance with another embodiment, however, the heat source 72 may provide heat through convection. For example, the heat source 72 may comprise a non-contact heat source such as an infrared lamp for remotely heating the thermal plate 70. In this case, the heat source 72 need not be coupled to the thermal plate 70 through a conductor 76. The radiation source 74 may be used to provide heating through radiation.

Figure 6:
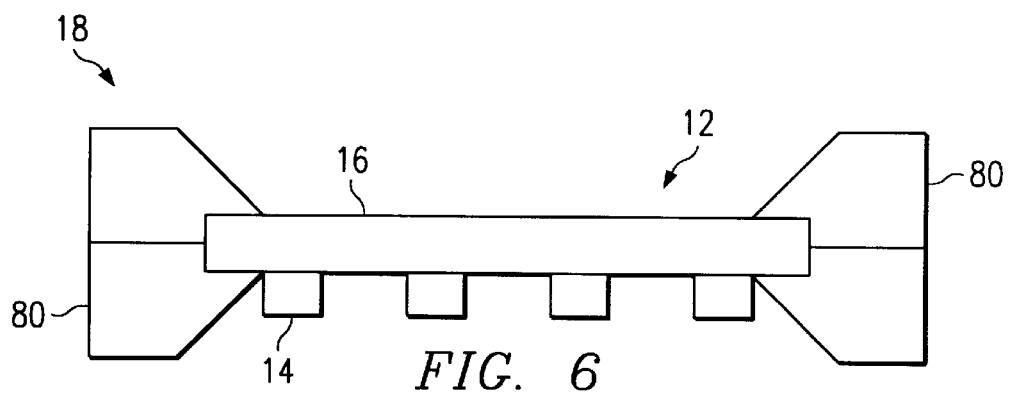
FIG. 6 is a block diagram illustrating the modulation system of FIG. 1 for varying the transmission of the mask in accordance with a fourth embodiment of the present invention.

FIG. 6 is a block diagram illustrating the modulation system 18 for varying the transmission of the attenuated phase shift mask 14 in accordance with a fourth embodiment of the present invention. According to this embodiment, the transmission percentage of the mask 14 is variable based on the amount of mechanical stress applied to the mask 14. Thus, the mask 14 may comprise a suitable crystalline material such as crystalline calcite or other suitable variable transmission material having a transmission percentage that varies with the application of mechanical stress.

Referring to FIG. 6, the modulation system 18 includes clamps 80 and a controlling device (not shown). The reticle 12 is secured by the clamps 80. Although the embodiment shown in FIG. 6 includes two clamps 80, it will be understood that any suitable number of clamps 80 may be utilized without departing from the scope of the present invention.

In operation, the clamps 80 compress, pull, or provide other variable mechanical stress on the reticle 12 in order to provide the desired transmission percentage for the mask 14. According to one embodiment, the clamps 80 may comprise piezoelectric materials for providing mechanical stress. The controlling device may control the amount and direction of the mechanical stress provided by the clamps 80.

It will be understood that the embodiments shown in FIGS. 3–6 may be used in combination with each other, in addition to separately. For example, a constant current source 52 may be used in conjunction with a heat source 72 to obtain a desired transmission percentage. Alternatively, a radiation source 74 may provide a constant radiation, while magnetic coils 60 provide an oscillating magnetic field. Thus, any suitable combination of these embodiments maybe implemented without departing from the scope of the present invention.

Thus, in accordance with the teachings of the present invention, a single mask 14 maybe fabricated for a particular application, considerably reducing the cost associated with developing the application. In addition, an optimum transmission percentage may be determined by varying the transmission percentage of the mask 14. Furthermore, more flexibility is provided in that the transmission percentage of the mask 14 may be varied during exposure of the photoresist layer 32 to light from the light source 20.

Although the present invention has been described with several embodiments, various changes and modifications may be suggested to one skilled in the art. It is intended that the present invention encompass such changes and modifications as fall within the scope of the appended claims.

What is claimed is:

1. A system for varying the transmission of an attenuated phase shift mask, comprising:
   an attenuated phase shift mask comprising a variable transmission material;
   a transparent support supporting the mask; and
   a modulation system operable to apply a variable force at the mask to control the transmission of the mask.

2. The system of claim 1,
   the modulation system further comprising:
      a transparent electrode coupled to the mask, and
      an adjustable power source coupled to the electrode, the power source operable to apply the variable force by generating a variable electric field at the mask; and
   wherein the variable transmission material varies in response to the variable electric field.

3. The system of claim 2, the transparent electrode forming at least part of the transparent support.

4. The system of claim 1,
   the modulation system further comprising a magnetic coil operable to apply the variable force by generating a variable magnetic field at the mask; and
   wherein the variable transmission material varies in response to the variable magnetic field.

5. The system of claim 1,
   the modulation system further comprising:
      a transparent thermal plate coupled to the mask, and
      an adjustable heat source operable to apply the variable force by generating a variable temperature at the mask; and
   wherein the variable transmission material varies in response to the variable temperature.

6. The system of claim 5, the transparent thermal plate forming at least part of the transparent support.

7. The system of claim 5, the adjustable heat source coupled to the mask.

8. The system of claim 1,
   the modulation system further comprising a clamp coupled to the mask, the clamp operable to apply the variable force by generating a variable amount of mechanical stress at the mask; and
   wherein the variable transmission material varies in response to the variable amount of mechanical stress.

9. The system of claim 8, the clamp comprising piezoelectric materials.

10. A method for varying the transmission of an attenuated phase shift mask, comprising:
    providing an attenuated phase shift mask comprising a variable transmission material;
    supporting the mask with a transparent support;
    applying a variable force at the mask; and
    varying the transmission of the mask in response to the force.

11. The method of claim 10,
    applying a variable force at the mask comprising:
       coupling a transparent electrode to the mask,
       coupling an adjustable power source to the electrode, and
       generating with the power source a variable electric field at the mask; and
    varying the transmission of the mask in response to the force comprising varying the transmission of the mask in response to the variable electric field.

12. The method of claim 11, the transparent electrode forming at least a part of the transparent support.

13. The method of claim 10,
    applying a variable force at the mask comprising:
       providing a magnetic coil, and
       generating with the magnetic coil a variable magnetic field at the mask; and
    varying the transmission of the mask in response to the force comprising varying the transmission of the mask in response to the variable magnetic field.

14. The method of claim 10,
    applying a variable force at the mask comprising:
       coupling a transparent thermal plate to the mask,
       coupling an adjustable heat source to the thermal plate, and
       generating with the heat source a variable temperature at the mask; and
    varying the transmission of the mask in response to the force comprising varying the transmission of the mask in response to the variable temperature.

15. The method of claim 14, the transparent thermal plate forming at least a part of the transparent support.

16. The method of claim 10,
    applying a variable force at the mask comprising:
       coupling a transparent thermal plate to the mask,
       providing an adjustable, non-contact heat source operable to provide heat at the thermal plate, and
       generating with the heat source a variable temperature at the mask; and
    varying the transmission of the mask in response to the force comprising varying the transmission of the mask in response to the variable temperature.

17. The method of claim 10,
    applying a variable force at the mask comprising:
       coupling a clamp to the mask, and
       generating with the clamp a variable amount of mechanical stress at the mask; and
    varying the transmission of the mask in response to the force comprising varying the transmission of the mask in response to the variable amount of mechanical stress generated by the clamp.

18. A method for forming an integrated circuit, comprising:
    providing a wafer;
    applying a photoresist layer outwardly of the wafer;
    providing an attenuated phase shift mask comprising a variable transmission material between the photoresist layer and a light source;
    applying a force at the mask;
    varying the transmission of the mask in response to the force; and patterning the photoresist layer by providing energy with the light source.

19. The method of claim 18, applying a force at the mask comprising:
   coupling a transparent electrode to the mask;
   coupling an adjustable power source to the electrode; and
   adjusting the power source to generate an electric field of a specified strength at the mask.

20. The method of claim 18, applying a force at the mask comprising:
   providing a magnetic coil; and
   adjusting the magnetic coil to generate a magnetic field of a specified strength at the mask.

21. The method of claim 18, applying a force at the mask comprising:
   coupling a transparent thermal plate to the mask;
   coupling an adjustable heat source to the thermal plate; and
   adjusting the heat source to generate a specified temperature at the mask.

22. The method of claim 18, applying a force at the mask comprising:
   coupling a clamp to the mask; and
   adjusting the clamp to generate a specified amount of mechanical stress at the mask.

* * * * *